US006806108B2

(12) United States Patent
Park et al.

(10) Patent No.: US 6,806,108 B2
(45) Date of Patent: Oct. 19, 2004

(54) METHOD OF MANUFACTURING MONOLITHIC INK-JET PRINTHEAD

(75) Inventors: Yong-shik Park, Gyeonggi-do (KR); Sang-wook Lee, Gyeonggi-do (KR); Jae-sik Min, Gyeonggi-do (KR); Seo-hyun Cho, Gyeonggi-do (KR); Keon Kuk, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/246,622

(22) Filed: Sep. 19, 2002

(65) Prior Publication Data

US 2003/0109073 A1 Jun. 12, 2003

(30) Foreign Application Priority Data

Dec. 10, 2001 (KR) ........................................ 2001-77795

(51) Int. Cl.[7] ......................... H01L 21/00; H01L 21/04; H01L 21/302; B41J 2/045

(52) U.S. Cl. ......................... 438/21; 438/510; 438/689; 347/68; 347/71

(58) Field of Search .......................... 438/21, 510, 689; 347/68, 71

(56) References Cited

U.S. PATENT DOCUMENTS

| | | | | |
|---|---|---|---|---|
| 4,882,595 | A | 11/1989 | Trueba et al. | |
| 6,499,832 | B2 * | 12/2002 | Lee et al. | 347/56 |

FOREIGN PATENT DOCUMENTS

| | | |
|---|---|---|
| EP | 1 078 754 | 2/2001 |
| EP | 1 078 754 A3 | 6/2001 |
| JP | 6-344562 | 12/1994 |

* cited by examiner

*Primary Examiner*—Alexander Ghyka
(74) *Attorney, Agent, or Firm*—Staas & Halsey LLP

(57) ABSTRACT

A method of manufacturing a monolithic ink-jet printhead includes preparing a silicon substrate, forming an ink passage comprising a manifold supplying ink, an ink chamber filled with ink supplied from the manifold, an ink channel connecting the ink chamber to the manifold, and a nozzle through which the ink is ejected from the ink chamber, on the silicon substrate, and reprocessing a wall of the ink passage by passing $XeF_2$ gas through the ink passage and dry etching the wall of the ink passage. In the reprocessing of the wall of the ink passage using $XeF_2$ gas, the wall of the ink passage is smoothed, and a size of the ink passage can be more precisely adjusted to a design dimension, thereby improving a printing performance of the ink-jet printhead.

31 Claims, 9 Drawing Sheets

METHOD OF MANUFACTURING MONOLITHIC INK-JET PRINTHEAD

CROSS-REFERENCE TO RELATED APPLICATIONS

This application claims the benefit of Korean Patent Application No. 2001-77795, filed Dec. 10, 2001, in the Korean Intellectual Property Office, the disclosure of which is incorporated herein by reference.

BACKGROUND OF THE INVENTION

1. Field of the Invention

The present invention relates to a method of manufacturing an ink-jet printhead, and more particularly, to a method of manufacturing a monolithic ink-jet printhead having an ink passage that is monolithically formed on a silicon substrate.

2. Description of the Related Art

In general, an ink-jet printhead is a device printing a predetermined color image by ejecting small droplets of printing ink onto a desired place of a recording sheet.

The ink-jet printhead may eject ink using an electro-thermal transducer (bubble jet-type ink ejection mechanism) which generates a bubble in ink using a heater, or using an electromechanical transducer, which causes a volume variation of ink by a deformation of a piezoelectric device.

The bubble jet-type ink ejection mechanism will be described in greater detail. When power is supplied to the heater having a resistance heating element, ink disposed adjacent to the heater is rapidly heated to a temperature of about 300° C. In such a case, the bubble is generated in the ink and expanded to apply pressure to the ink filling an ink chamber. As a result, the ink near a nozzle is ejected from the ink chamber through the nozzle.

FIGS. 1A and 1B are examples of a conventional bubble jet type ink-jet printhead, and give an exploded perspective view showing a structure of the conventional bubble jet type inkjet printhead disclosed in U.S. Pat. No. 4,882,595 and a cross-sectional view illustrating a method of ejecting an ink droplet in the conventional bubble jet type ink-jet printhead, respectively.

Referring to FIGS. 1A and 1B, the conventional bubble jet-type ink-jet printhead includes a substrate 10, a barrier wall 38 installed on the substrate 10 to form an ink chamber 26 filled with ink 49, a heater 12 installed in the ink chamber 26, and a nozzle plate 18 in which a nozzle 16 is formed through which an ink droplet 49' is ejected. The ink chamber 26 is filled with the ink 49 through an ink channel 24 from an ink supply manifold 14 connected to an ink reservoir (not shown), and the nozzle 16 connected to the ink chamber 26 is filled with the ink 49 by capillary action. A plurality of nozzles 16, a plurality of heaters 12 corresponding to the plurality of nozzles 16, and the ink chambers 26 are arranged in columns adjacent to the ink supply manifold 14 or in columns at both sides of the ink supply manifold 14.

In the above structure, when current is supplied to the heater 12, the heater 12 generates heat to form a bubble 48 in the ink 49 filling the ink chamber 26. After that, the bubble 48 is expanded to apply pressure to the ink 49 and push the ink droplet 49' out of the ink chamber 26 through the nozzle 16. New ink 49 is sucked through the ink channel 24 to refill the ink chamber 26.

However, in order to manufacture the conventional printhead having the above structure, the nozzle plate 18 and the substrate 10 should be separately manufactured and bonded to each other, resulting in a complicated printhead manufacturing process, and causing a misalignment of the nozzle plate 18 and the substrate 10 when the nozzle plate 18 is bonded to the substrate 10.

Thus, recently, in order to solve the above problems, an ink-jet printhead that is monolithically formed on a silicon substrate has been suggested. The printhead is usually manufactured by using semiconductor device manufacturing techniques such as deposition of material layers, photolithography, and etching. These techniques prevent the misalignment between elements of the printhead, and since they are based on conventional semiconductor device manufacturing processes, the printhead manufacturing process might be simplified, and mass production is facilitated.

As an example of a printhead that is monolithically formed on a silicon substrate, another structure of the conventional ink-jet printhead disclosed in European Publication Patent No. EP 1 078 754 A2 is shown in FIG. 2.

Referring to FIG. 2, a plurality of thin material layers 52, 54, 56, and 58 are stacked on a silicon substrate 50. A resistor layer 70 for heating ink is formed between the material layers 52, 54, 56, and 58. The material layers 52, 54, 56, and 58 and the resistor layer 70 are formed by oxidation of a surface of the silicon substrate 50, deposition of a predetermined material on the silicon substrate 50, and etching using an etch mask formed by photolithography. An ink feed hole 74 is formed to perforate the material layers 52, 54, 56, and 58. The ink feed hole 74 is formed by dry or wet etching the material layers 52, 54, 56, and 58 after forming the etch mask on the material layers 52, 54, 56, and 58 by a photolithographic process. An ink supply manifold 72 is formed by dry or wet etching a rear side of the silicon substrate 50. An orifice layer 60 defining a nozzle 78 and an ink chamber 76 is formed on the material layers 532, 54, 56, and 58. The orifice layer 60 is formed by coating a photoresist on the material layers 52, 54, 56, and 58 through lamination, screen printing, or spin coating, and the nozzle 78 and the ink chamber 76 are formed by the photolithographic process.

As described above, in the ink-jet printhead having the structure shown in FIG. 2, elements constituting an ink passage on the silicon substrate 50, that is, the ink supply manifold 72, the ink feed hole 74, the ink chamber 76, and the nozzle 78 are formed through photolithography and/or etching, and thus the ink-jet printhead having the structure shown in FIG. 2 might have the advantages described above.

However, according to the conventional method of forming the ink passage described above, the ink passage is formed by a dry etching technique, such as reactive ion etching or inductively coupled plasma etching, or by a wet etching technique using KOH and TMAH. Dry etching is mostly anisotropic etching, and since it is difficult to process the ink passage having a complicated internal structure, there are limitations in a processing depth of the ink passage, and a processed surface of the ink passage is also rough. In addition, undesired portions are etched, and since the etch mask must be formed by the photolithographic process, a processing time and a manufacturing cost of the ink-jet printhead increase. In the case of wet etching, the processed surface is comparatively flat, but the etching process easily etches other materials as well as silicon, and thus, it is difficult to selectively etch only a desired portion, and the etching time is extended compared to the dry etching.

As described above, according to the conventional method of manufacturing a monolithic ink-jet printhead using dry etching and wet etching in consideration of a shape and size of the ink passage, the wall of the ink passage is comparatively rough, and it is difficult to precisely adjust the size of the ink passage to a design dimension.

SUMMARY OF THE INVENTION

To solve the above and other problems, it is an object of the present invention to provide a method of manufacturing a monolithic ink-jet printhead, the method particularly including reprocessing an internal side of the ink passage using $XeF_2$ gas after forming the ink passage on a silicon substrate.

Additional objects and advantageous of the invention will be set forth in part in the description which follows and, in part, will be obvious from the description, or may be learned by practice of the invention.

Accordingly, to achieve the above and other objects, there is provided a method including forming an ink passage on a silicon substrate, the ink passage having a manifold supplying ink, an ink chamber receiving the ink from the manifold, an ink channel connecting the manifold to the ink chamber, and a nozzle through which the ink is ejected from the ink chamber.

In the method of manufacturing the printhead according an embodiment of the present invention, the ink passage is reprocessed using $XeF_2$ gas after the ink passage is formed on the silicon substrate.

Since the $XeF_2$ gas does not react with any material other than silicon in an etching process using the $XeF_2$ gas, the $XeF_2$ gas has much higher selectivity to silicon than silicon nitride, silicon oxide, photoresist or aluminum. Thus, using the $XeF_2$ gas in the reprocessing of the ink passage allows only the silicon substrate having a wall defining the ink passage to be etched without affecting other material layers.

An equation of the $XeF_2$ gas and silicon is below:

$$2XeF_2+Si\rightarrow 2Xe+SiF_4.$$

In the above equation, when the $XeF_2$ gas contacts the silicon substrate, the silicon (Si) on the surface of the silicon substrate chemically reacts with the $XeF_2$ gas to form $SiF_4$. The $SiF_4$ can be separated from a surface of the silicon substrate, and thus the surface of the silicon substrate can be etched to a predetermined depth.

The surface of the silicon substrate etched by the $XeF_2$ gas becomes smooth compared with other dry or wet etching methods. Thus, walls of the ink passage can be smoothed in an operation of reprocessing the ink passage.

In addition, since only $XeF_2$ gas is used and plasma is not used in the operation of reprocessing the ink passage, an electric circuit is not damaged by electric and magnetic influence.

The $XeF_2$ gas has a property of isotropic etching only on the silicon substrate without effect on a crystal orientation of other material layers. Thus, since the walls of the ink passage having a complicated structure can be uniformly processed in an operation of forming the ink passage, a size of the ink passage can be more precisely adjusted to a design dimension.

In addition, a shape (surface) of the ink passage slopes when the $XeF_2$ gas is properly controlled. That is, in the operation of reprocessing the ink passage, the wall of the ink channel can be reprocessed to slope so that a cross-sectional area of the ink channel becomes narrower from the manifold to the ink chamber. As a result, a supply speed of the ink can be increased, and a back flow of the ink can be prevented. This is possible by controlling a flow speed of the $XeF_2$ gas.

Meanwhile, according to an aspect of the present invention, the forming of the ink passage includes forming a membrane layer in which a plurality of material layers are stacked on the silicon substrate, forming the nozzle by etching the membrane layer to a predetermined diameter, forming the ink chamber by etching the silicon substrate exposed through the nozzle, forming the manifold by etching the rear side of the silicon substrate, and forming the ink channel by etching the silicon substrate between the ink chamber and the manifold.

Here, according to another aspect of the present invention, the forming of the membrane layer includes forming an insulating layer on the surface of the silicon substrate, forming a heater surrounding the nozzle on the insulating layer and forming a first passivation layer for protecting the heater on the insulating layer and the heater, and forming an electrode to be electrically connected to the heater on the first passivation layer and forming a second passivation layer for protecting the electrode on the first passivation layer and the electrode.

According to yet another aspect of the present invention, the forming of the ink chamber includes isotropic dry etching the silicon substrate through the nozzle to form a hemisphere of the ink chamber.

In the method of manufacturing a monolithic ink-jet printhead, the ink passage of the ink-jet printhead that is monolithically formed on the silicon substrate is reprocessed using $XeF_2$ gas, smoothing the walls of the ink passage, more precisely adjusting the size of the ink passage to the design dimension, and improving a performance of the printhead.

BRIEF DESCRIPTION OF THE DRAWINGS

These and other objects and advantageous of the invention will become apparent and more readily appreciated from the following description of the preferred embodiments, taken in conjunction with the accompanying drawings of which.

DETAILED DESCRIPTION OF THE PREFERRED EMBODIMENTS

Figure 1A:
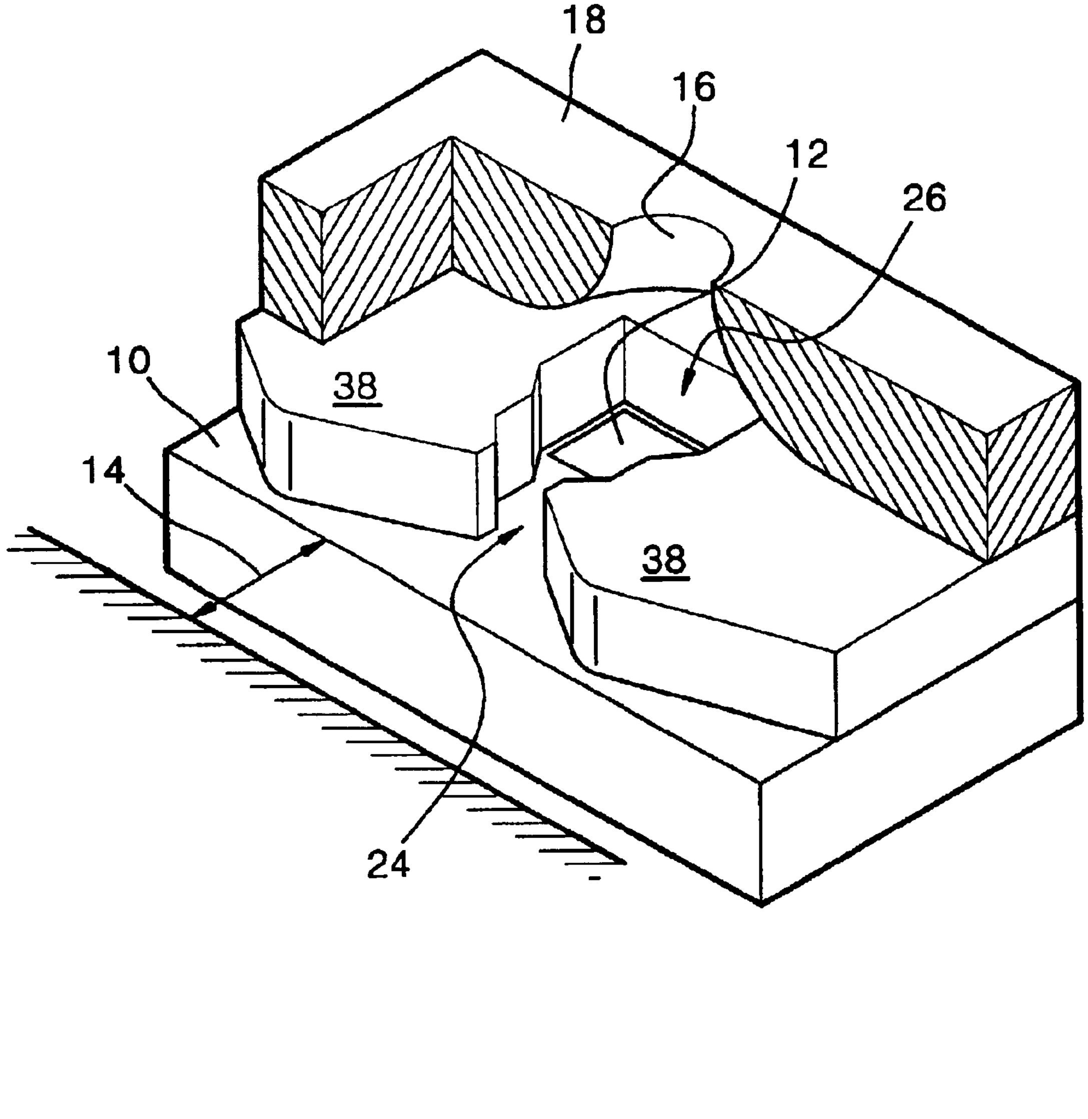
FIG. 1A (PRIOR ART)
FIGS. 1A and 1B are an exploded perspective view illustrating an example of a conventional bubble jet-type ink-jet printhead and a cross-sectional view illustrating a method of ejecting an ink droplet in the conventional bubble jet-type ink-jet printhead, respectively.
Figure 1B:
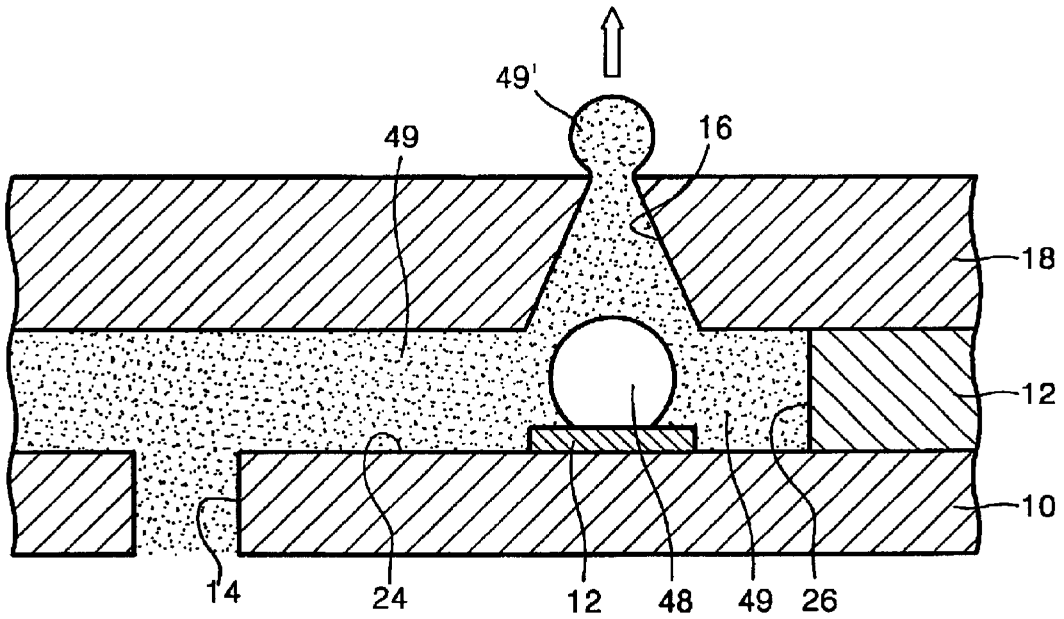
FIG. 1B (PRIOR ART)
Figure 2:
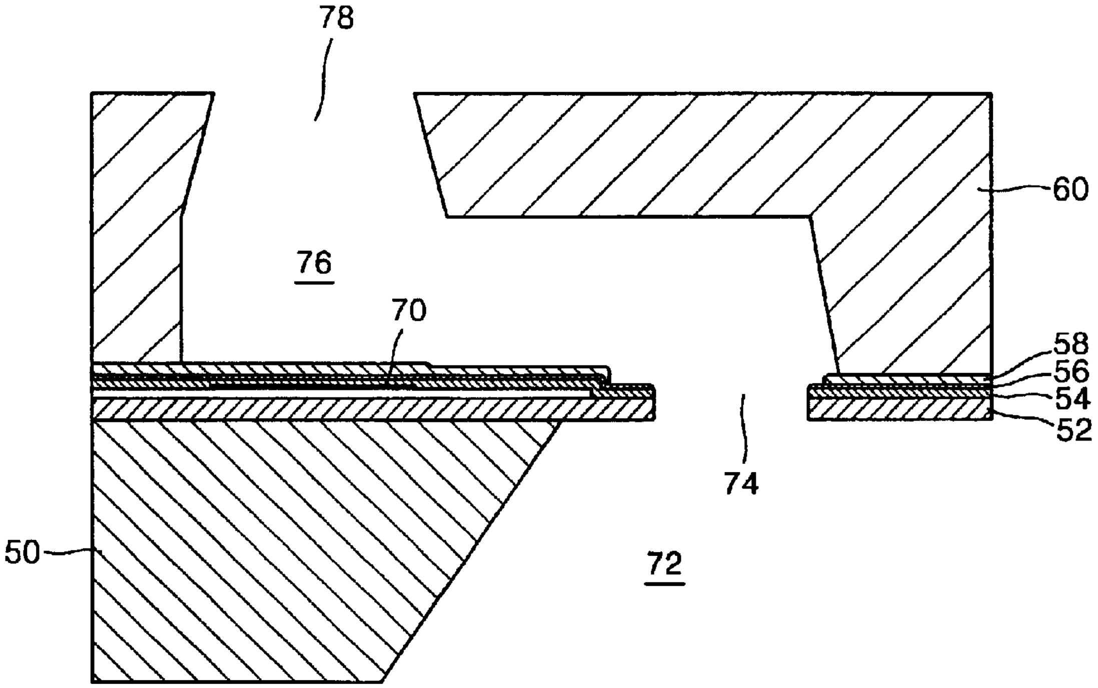
FIG. 2 (PRIOR ART)
FIG. 2 is a schematic cross-sectional view illustrating another example of the conventional bubble jet-type ink-jet printhead.

Reference will now be made in detail to the present preferred embodiments of the present invention, examples of which are illustrated in the accompanying drawings, wherein like reference numerals refer to the like elements throughout. The embodiments are described in order to explain the present invention by referring to the figures. It will be understood that when a layer is described to be formed on another layer or a semiconductor substrate, the layer can be directly formed on another layer or the semiconductor substrate, or an intervening layer may exist between the layer and another layer or the semiconductor substrate.

An example of a monolithic ink-jet printhead, which may be manufactured by a method of manufacturing the monolithic ink-jet printhead according to an embodiment of the present invention, will be described with reference to FIG. 3.

Figure 3:
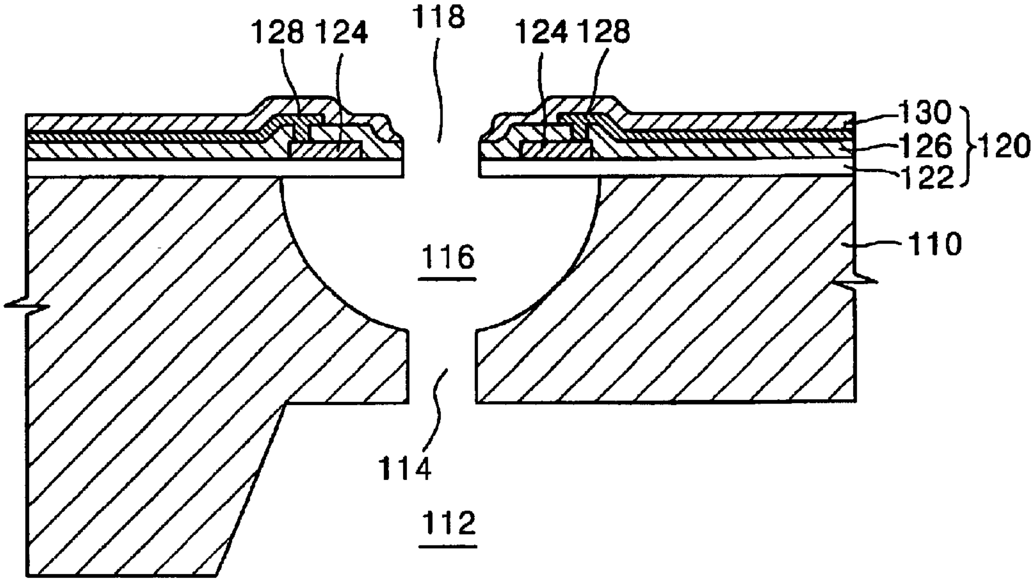
FIG. 3 is a longitudinal cross-sectional view illustrating a monolithic ink-jet printhead manufactured by a method of manufacturing the monolithic ink-jet printhead according to an embodiment of the present invention.

As shown in FIG. 3, an ink chamber 116, which is filled with ink, is formed on a front side of a substrate 110, and a manifold 112 supplying the ink to the ink chamber is formed at a rear side of the substrate 110. Here, the substrate 110 is formed of silicon, which is generally used in manufacturing an integrated circuit (IC), and the ink chamber 116 is approximately hemispherical.

An ink channel 114 connecting the ink chamber 116 to the manifold 112 is formed between the ink chamber 116 and the manifold 112. It is possible that the ink channel 114 has a circular cross section. However, the ink channel 114 may have various cross sectional shapes, such as an ellipse or polygon, instead of a circle A plurality of material layers are stacked on a front surface of the substrate 110 to form a membrane layer 120 which acts as an upper wall of the ink chamber 116. A nozzle 118 is provided in the membrane layer 120 to be aligned with a center of the ink chamber 116 and the ink channel 114.

A lowermost layer of the membrane layer 120 is an insulating layer 122, which may be a silicon oxide layer formed by oxidizing the silicon substrate 110.

A heater 124 generating bubbles is formed on the insulating layer 122 to surround the nozzle 118. It is possible that the heater 124 has a circular ring shape and includes a resistance heating element such as impurity-doped polysilicon or tantalum-aluminum alloy.

A first passivation layer 126 protecting the heater 124 is formed on the insulating layer 122 and the heater 124. It is possible that a silicon nitride layer is used as the first passivation layer 126.

An electrode 128 made of a conductive metal is formed on the first passivation layer 126 to transmit a pulse current to the heater 124.

A second passivation layer 130 protecting the electrode 128 is formed on the first passivation layer 126 and the electrode 128. A silicon oxide layer or tetraethylorthosilicate (TEOS) oxide layer may be used as the second passivation layer 130.

Hereinafter, an ink droplet ejection mechanism in the monolithic ink-jet printhead having the above structure will be described with reference to FIGS. 4A and 4B.

Figure 4A:
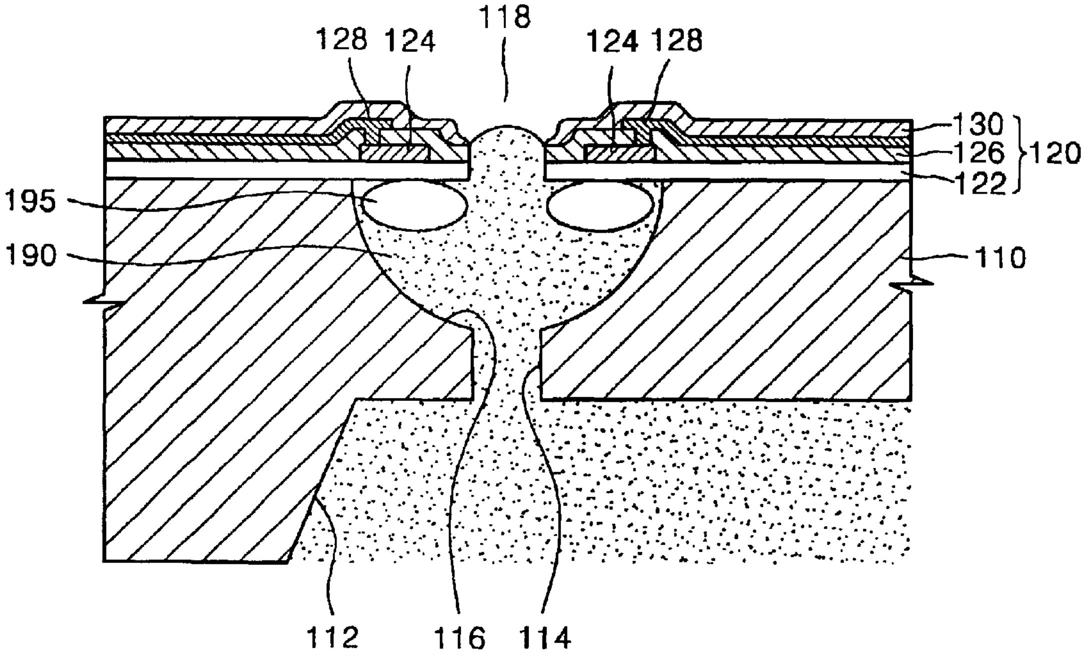
FIGS. 4A and 4B are cross-sectional views illustrating an ink droplet ejection mechanism in the monolithic ink-jet printhead shown in FIG. 3.
Figure 4B:
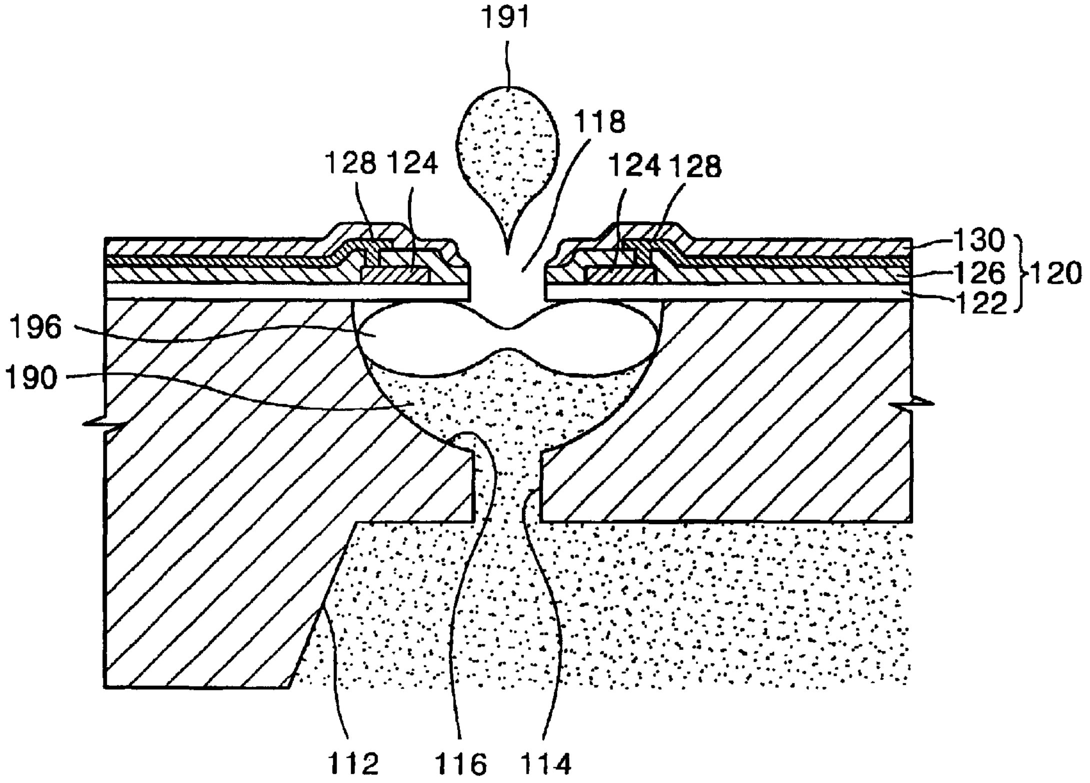

Referring to FIG. 4A, ink 190 is supplied into the ink chamber 116 through the manifold 112 and the ink channel 114 by capillary action. When the ink chamber 116 is filled with the ink 190, and when the pulse current is supplied to the heater 124 through the electrode 128, heat is generated by the heater 124. The heat is transferred to the ink 190 in the ink chamber 116 through the insulating layer 122 disposed under the heater 124. As a result, the ink 190 boils to generate a bubble 195. The bubble 195 is approximately doughnut shaped depending on the shape of a heater 124.

The doughnut-shaped bubble 195 is expanded to become a disc-shaped bubble 196 under the nozzle 118. An ink droplet 191 is ejected from the ink chamber 116 through the nozzle 118 by a pressure generated by the expanded bubble 196. In such a case, a tail of the ejected ink droplet 191 is cut by the disc-shaped bubble 196 to prevent any satellite droplets following the ink droplet 191. In addition, since the ink chamber 116 is hemispherical, an expansion path of the bubble 195 and 196 is stable compared with a conventional ink chamber having a rectangular hexahedron or pyramid shape.

When the pulse current is not supplied to the heater 124, the bubble 196 cools and contracts or breaks, and thus the ink chamber 116 is filled again with new ink 190 through the ink channel 114.

Hereinafter, a method of manufacturing the monolithic ink-jet printhead having the above structure as shown in FIG. 3 will be described with reference to drawings by stages.

Figure 11:
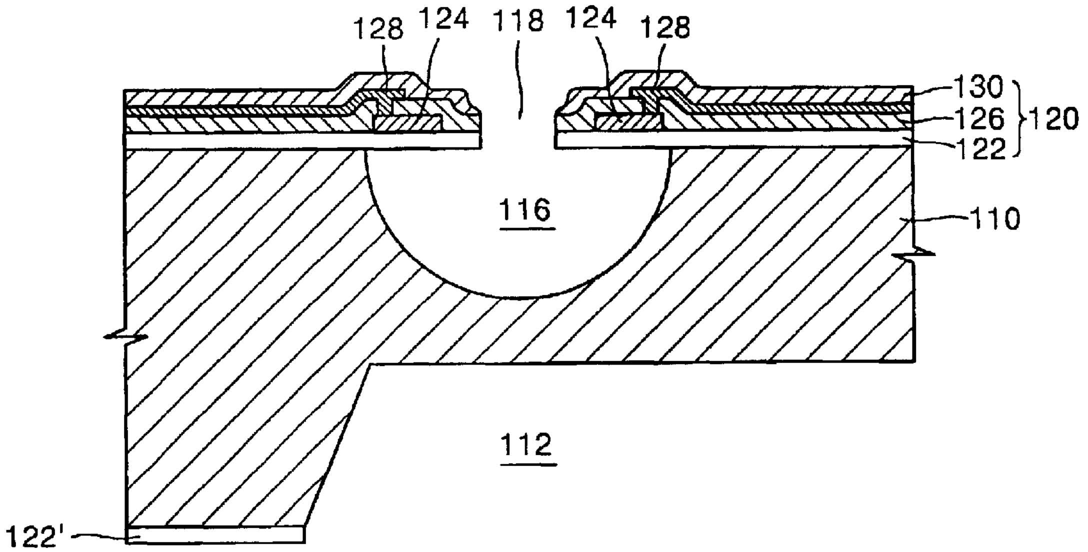
Figure 12:
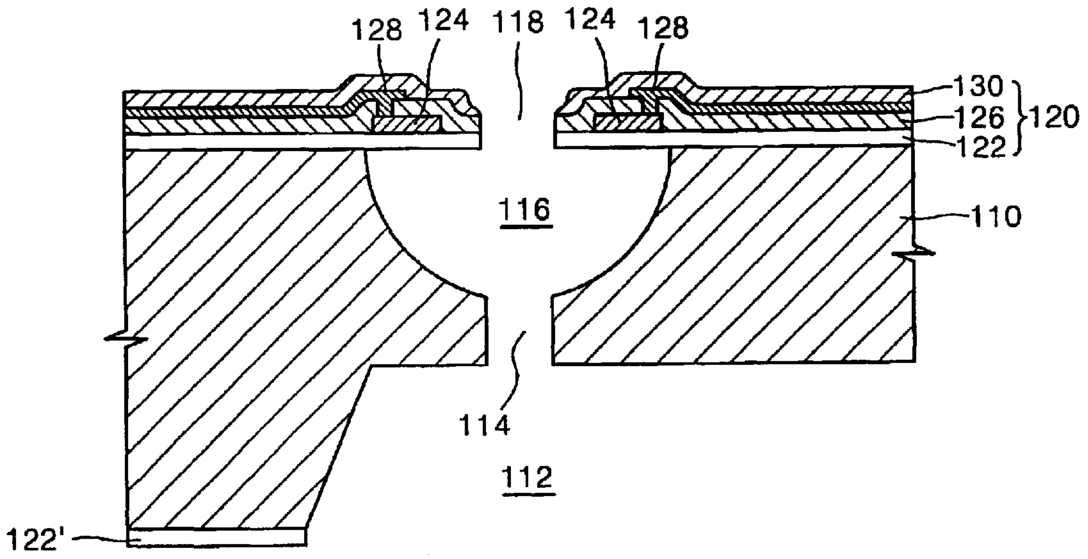
Figure 13:
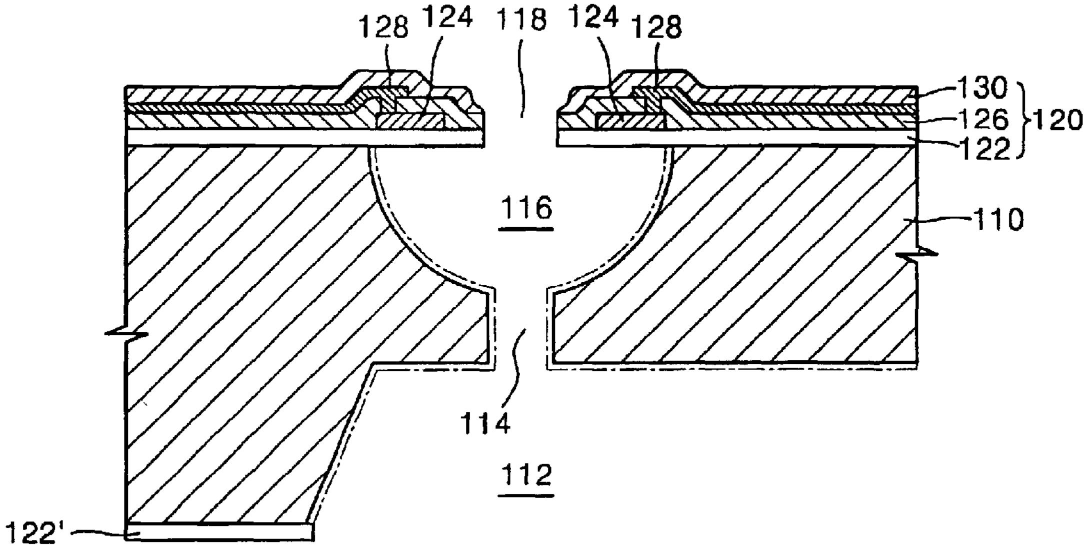
Figure 14:
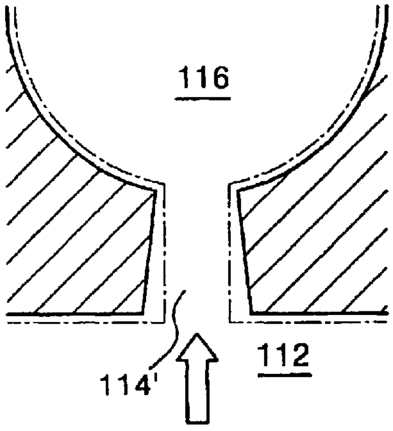
FIG. 14 is an enlarged cross-sectional view of an ink channel shown in FIG. 13.

FIGS. 5 through 13 are cross-sectional views illustrating respective operations of the method of manufacturing the monolithic ink-jet printhead, and FIG. 14 is a partially enlarged cross-sectional view of an ink channel shown in FIG. 13.

Figure 5:
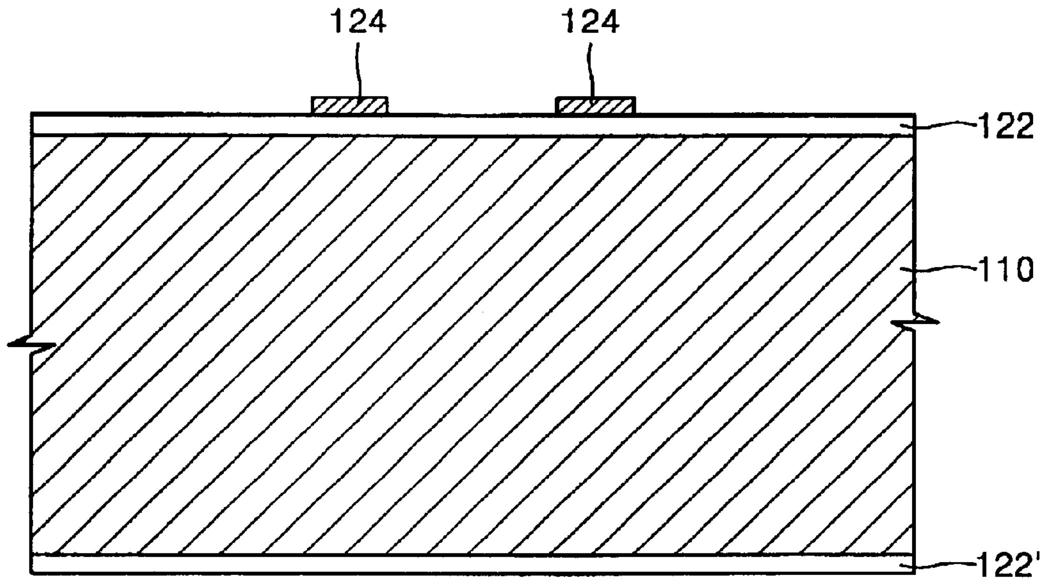
FIGS. 5 through 13 are cross-sectional views illustrating a method of manufacturing the monolithic ink-jet printhead of FIG. 3.

Referring to FIG. 5, a silicon substrate is used as a substrate 110. Since the silicon substrate is used as the substrate 110, a silicon wafer, which is used for manufacturing semiconductor products, is effective in mass production of the monolithic ink-jet printhead. When the silicon substrate 110 is put into in an oxidation furnace and wet or dry oxidized, the front surface and a rear surface of the silicon substrate 110 are oxidized, thereby forming corresponding silicon oxide layers 122 and 122'. The silicon oxide layer 122 on the front surface of the substrate 110 is an insulating layer described previously, and the silicon oxide layer 122' on the rear surface of the substrate 110 may be used as an etch mask to form the manifold 112 as shown in FIG. 11.

FIG. 5 illustrates a small part of a silicon wafer, through which tens or hundreds of chips corresponding to the print head are manufactured. In FIG. 5, the silicon oxide layers 122 and 122' are formed both on the front surface and the rear surface of the substrate 110. For this reason, a batch type oxidizing furnace is used, in which the rear surface of the silicon wafer is also exposed to an oxidizing atmosphere. However, in a case of using a single wafer type oxidizing furnace, in which only the front surface of the silicon wafer is exposed to the oxidizing atmosphere, the silicon oxide layer 122' is not formed on the rear side of the substrate 110.

Subsequently, the heater 124 is formed on the silicon oxide layer 122 on the surface of the substrate 110. The heater 124 is formed by depositing an impurity-doped polysilicon layer on an entire surface of the silicon oxide layer 122 and by patterning the impurity-doped polysilicon layer in an annular shape. Specifically, the impurity-doped polysilicon layer may be deposited with a source gas, such as phosphorous (P) as an impurity, through low pressure chemical vapor deposition (LP CVD) and may be formed to a thickness of about 0.7–1 μm. The deposition thickness of the impurity-doped polysilicon layer may be within another range to achieve a resistance appropriate to a width and a length of the heater 124. The impurity-doped polysilicon layer, which is deposited on the entire surface of the silicon oxide layer 122, is patterned using the photolithographic process using a photomask and a photoresist and by an etching process using a photoresist pattern as an etching mask.

Figure 6:
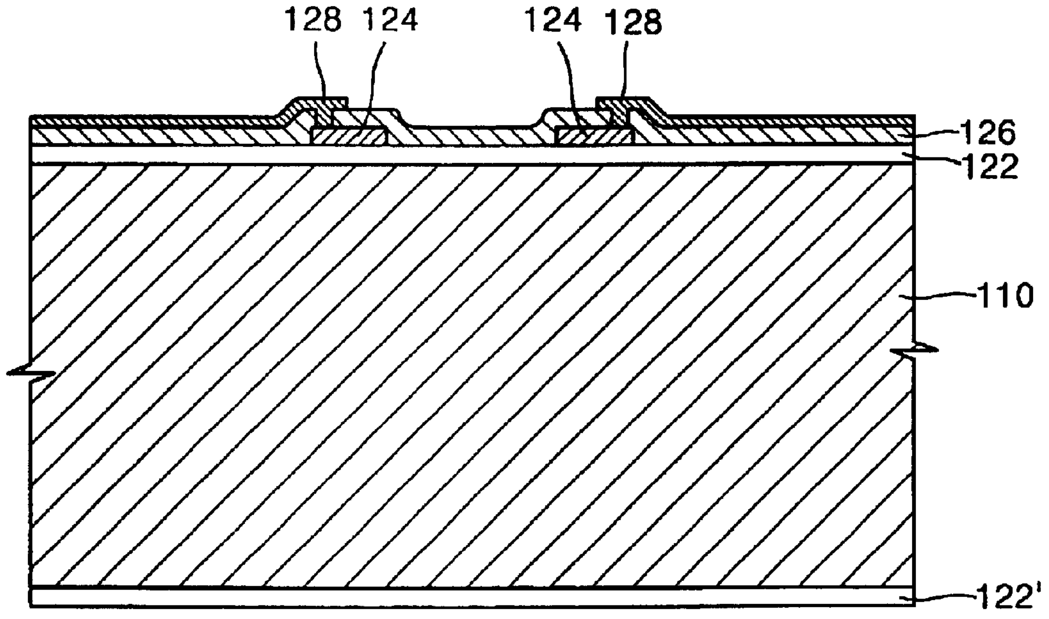

In FIG. 6, the first passivation layer 126 protecting the heater 124 is formed on the silicon oxide layer 122 and the heater 124, and the electrode 128 is formed on the first passivation layer 126 and a portion of the heater 124 to be electrically coupled to the heater 124. Specifically, the first passivation layer 126 may be formed by depositing a silicon nitride layer to a thickness of about 0.5 μm through CVD. The first passivation layer 126 is partially etched, thereby exposing the portion of the heater 124 to be connected to the electrode 128. The electrode 128 may be formed by depositing metal of good conductivity which is easily patterned, such as, aluminum or aluminum alloy, to a thickness of about 1 μm through sputtering deposition.

Figure 7:
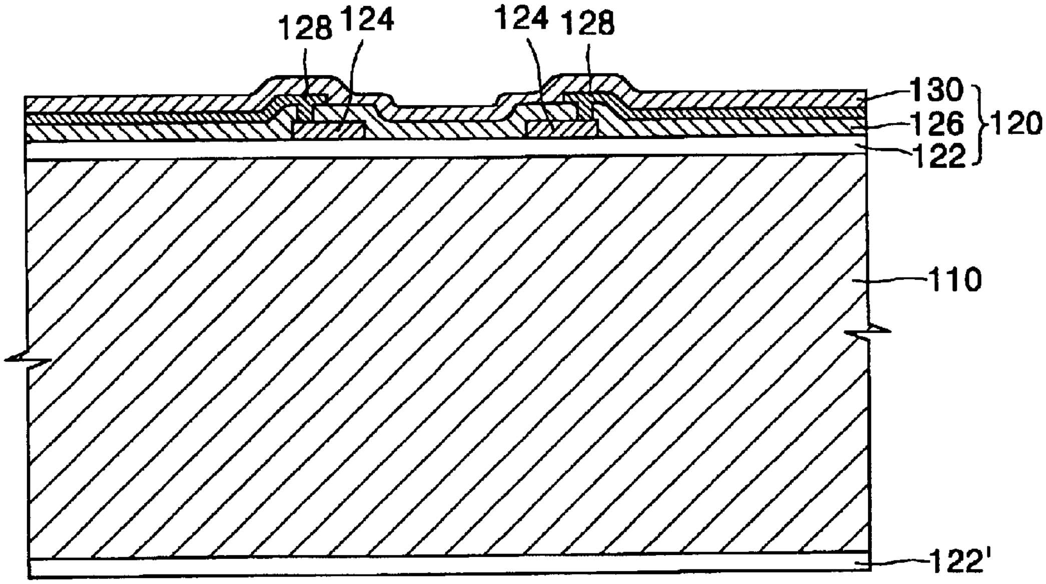

In FIG. 7, the second passivation layer 130 protecting the electrode 128 is formed on the electrode 128 and the first passivation layer 126 on which the electrode 128 is formed. Specifically, the second passivation layer 130 may be formed by depositing a TEOS oxide layer to a thickness of about 0.7–1 μm through plasma CVD.

As a result, the membrane layer 120 having a plurality of material layers, that is, the silicon oxide layer 122, the first passivation layer 126, and the second passivation layer 130, is formed (stacked) on the substrate 110.

Figure 8:
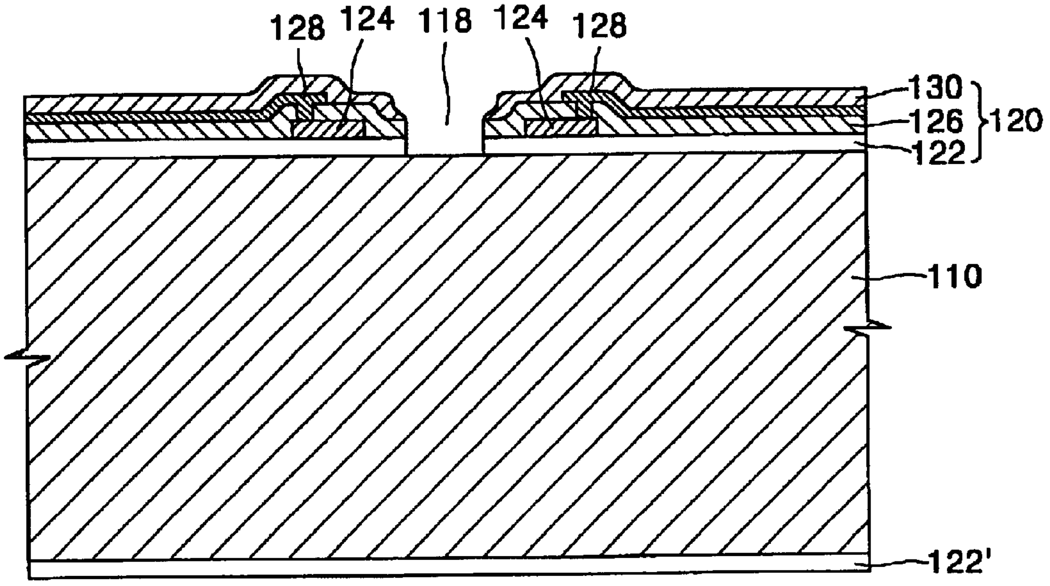

In FIG. 8, the nozzle 118 through which ink is ejected is formed in the membrane layer 120. Specifically, the second passivation layer 130, the first passivation layer 126, and the silicon oxide layer 122 are sequentially etched to a diameter smaller than an inside diameter of the heater 124, for example, to a diameter of about 16–20 μm within the heater 124, thereby forming the nozzle 118. The nozzle 118 may be formed by the photolithographic process using the photomask and the photoresist and the etching process using the photoresist pattern as the etch mask.

Figure 9:
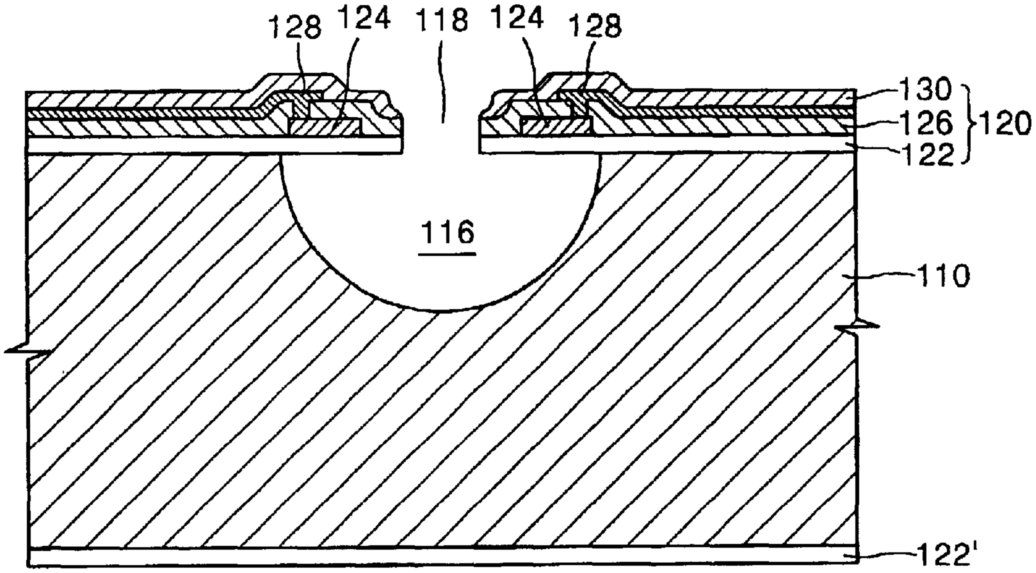

In FIG. 9, the ink chamber 116 is formed. Specifically, the ink chamber 116 may be formed through isotropic dry etching the substrate 110 exposed through the nozzle 118. Then, as shown in FIG. 9, the ink chamber 116 having an approximately hemispherical shape is formed to a depth and radius of about 20–30 μm.

Figure 10:
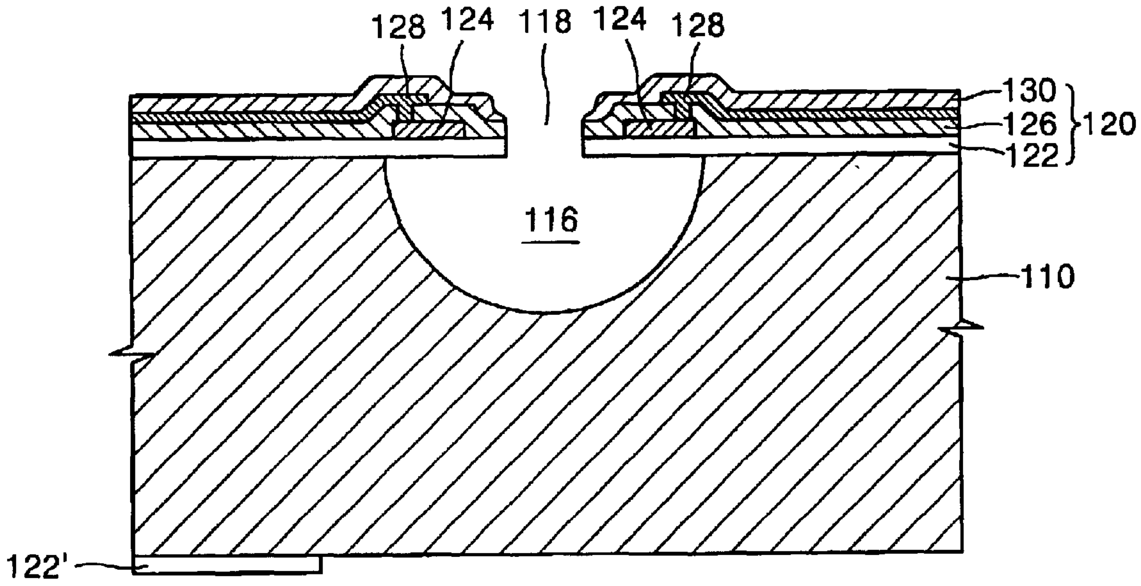

FIGS. 10 and 11 illustrate an operation of forming the manifold 112 by etching the rear side of the substrate 110.

As shown in FIG. 10, the rear side of the substrate 110 in which the manifold 112 of FIG. 11 is to be formed is exposed by etching the silicon oxide layer 122' formed on the rear surface of the substrate 110. Etching the silicon oxide layer 122' may be performed by using the photoresist as the etch mask.

As shown in FIG. 11, the manifold 112 is formed by etching the exposed rear side of the substrate 110 using the silicon oxide layer 122' that remains on the rear side of the substrate 110 as the etch mask. Specifically, when the rear side of the substrate 110 is wet etched for a predetermined time by using tetramethyl ammonium hydroxide (TMAH) as an etchant, etching is slower in a crystal orientation of {111} than in other orientations, thereby forming the manifold 112 having a slope of about 54.7° with respect to the rear surface of the substrate 110 or a bottom wall of the manifold 112 coupled to the ink channel 114. The angle of the slope may be about 35.3° with respect to a common central axis of the nozzle 118, the ink chamber 116, and the ink channel 114. The manifold 112 may be formed through the anisotropic dry etching as well as the wet etching.

In FIG. 12, the ink channel 114 connecting the ink chamber 116 to the manifold 112 is formed. Specifically, when the substrate 110 forming a bottom surface of the ink chamber 116 is an isotropic dry etched through the nozzle 118, the ink channel 114 is formed vertically. Thus, a cross section of the ink channel 114 is a circle like that of the nozzle 118, and a size of the ink channel 114 is equal to or less than that of the nozzle 118 in cross-section. The anisotropic dry etching may be performed through inductively coupled plasma etching or reactive ion etching.

Last, FIG. 13 illustrates an operation in which the walls of the manifold 112, the ink channel 114, and the ink chamber 116 are dry etched to a predetermined depth using $XeF_2$ gas. The $XeF_2$ gas has a much higher selectivity to silicon than other materials and thus does not affect other material layers as shown in FIG. 13. Only the silicon substrate 110 having the walls defining the manifold 112, the ink channel 114, and the ink chamber 116 is etched. Since only $XeF_2$ gas is used, and since plasma is not used, the electrode 128 formed on the substrate 110 or a driving circuit (not shown) are not damaged by electric and magnetic influence of the etching of the walls. In addition, as described previously, the walls of the manifold 112, the ink channel 114, and the ink chamber 116 are smoothed in this operation to allow ink to flow much smoothly.

In addition, when an etching time of the $XeF_2$ gas is adjusted, an etching depth of the walls can be controlled, and thus the size of the manifold 112, the ink channel 114, and the ink chamber 116 can be more precisely adjusted to a design dimension.

In particular, as shown in FIG. 12, a diameter of the ink channel 114 is equal to or less than that of the nozzle 118, and the diameter of the ink channel 114 can be increased as shown in FIG. 13, thereby increasing a supply speed of ink from the manifold 112 to the ink chamber 116.

In addition, as shown in FIG. 14, the wall of an ink channel 114' is etched to slope, so that the ink channel 114' narrows from the manifold 112 to the ink chamber 116. Specifically, when the $XeF_2$ gas is injected from the manifold 112 and when a flow speed of the $XeF_2$ gas is sufficiently low, the wall at an entrance of the ink channel 114' is exposed to the $XeF_2$ gas for a longer time than an outlet of the ink channel 114' and is etched more than the wall at the outlet of the ink channel 114' to form the ink channel 114' having a frustum of a cone shape as shown in FIG. 14. In the ink channel 114' having the above shape, the entrance of the ink channel 114' toward the manifold 112 is widened to allow a high ink supply speed from the manifold 112 toward the ink chamber 116, and the outlet of the ink channel 114' toward the ink chamber 116 is comparatively narrow to prevent a back flow of the ink when the ink droplet is ejected.

As described above, in the method of manufacturing the monolithic ink-jet printhead according to the present invention, the ink passage of the ink-jet printhead that is monolithically formed on the silicon substrate is reprocessed using the $XeF_2$ gas, thereby smoothing the walls of the ink passage, precisely adjusting the size of the ink passage to a design dimension, and improving a performance of the printhead.

In addition, according to the present invention, the wall of the ink channel can be reprocessed to slope so that the ink channel narrows from the manifold to the ink chamber, thereby increasing the ink supply speed and preventing the back flow. As a result, a driving frequency is improved, and a cross-talk between adjacent nozzles is suppressed to improve ink ejection characteristics.

Although the preferred embodiment of the present invention was described in detail, the scope of the present invention is not limited to this, and various changes or other embodiments may be made. That is, the method of manufacturing the monolithic ink-jet printhead using the operation of reprocessing the ink passage can be employed in the monolithic ink-jet printhead having various structures as well as that described above.

Materials other than those shown above may be used in the printhead in the present invention, and methods of stacking and forming each material are given only as illustrations of some of the various deposition and etching methods that may be used. Furthermore, specific dimensions illustrated in each operation can be adjusted without departing from the scope within which the printhead normally operates.

Furthermore, the order of the operations may be arranged to be different as the occasion demands, for instance, the manifold may be formed before the ink chamber or nozzle is formed.

Although a few preferred embodiments of the present invention have been shown and described, it would be appreciated by those skilled in the art that changes may be made in this embodiment without departing from the principles and sprit of the invention, the scope of which is defined in the claims and their equivalents.

What is claimed is:

1. A method of manufacturing a monolithic ink-jet printhead, the method comprising:

preparing a silicon substrate;

forming an ink passage comprising a manifold supplying ink, an ink chamber filled with the ink supplied from the manifold, an ink channel connecting the ink chamber to the manifold, and a nozzle through which the ink is ejected from the ink chamber, on the silicon substrate; and reprocessing the ink passage by passing $XeF_2$ gas through the ink passage and dry etching a wall defining the ink passage.

2. The method of claim 1, wherein the reprocessing of the wall of the ink passage comprises;

forming a slope on the wall defining the ink channel so that the ink channel narrows from the manifold to the ink chamber.

3. The method of claim 1, wherein the forming of the ink passage comprises:

forming a membrane layer in which a plurality of material layers are stacked on a first side of the silicon substrate;

forming the nozzle by etching the membrane layer to a predetermined diameter;

forming the ink chamber by etching the first side of the silicon substrate exposed through the nozzle;

forming the manifold by etching a second side of the silicon substrate; and forming the ink channel by etching the silicon substrate between the ink chamber and the manifold.

4. The method of claim 3, wherein the forming of the membrane layer comprises:

forming an insulating layer on a surface of the first side of the silicon substrate;

forming a heater on the insulating layer to surround the nozzle and forming a first passivation layer on the heater and the insulation layer to protect the heater formed on the insulating layer; and forming an electrode electrically connected to the heater on the first passivation layer and forming a second passivation layer on the first passivation layer and the electrode to protect the electrode.

5. The method of claim 3, wherein the forming of the ink chamber comprises:

isotropically dry etching the silicon substrate through the nozzle to form a shape of the ink chamber in a hemisphere.

6. The method of claim 3, wherein the forming of the ink channel comprises anisotropically dry etching the silicon substrate from a bottom surface of the ink chamber through the nozzle; and the reprocessing of the ink passage comprises:

reprocessing the wall of the ink channel to form a slope so that the diameter of the ink channel is greater than that of the nozzle, and that the ink channel narrows from the manifold to the ink chamber.

7. A method of manufacturing a monolithic ink-jet printhead, the method comprising:

preparing a silicon substrate;

forming on the substrate a membrane having a heater and a nozzle on the substrate;

forming in the substrate an ink passage communicating with the nozzle of the membrane; and reprocessing a wall defining the ink passage using $XeF_2$ gas.

8. The method of claim 7, wherein the forming of the membrane comprises:

forming a first silicon oxide layer on a first surface of the silicon substrate;

forming the heater on the first silicon oxide layer;

forming a passivation layer on the heater; and forming the nozzle in an area inside the heater.

9. The method of claim 7, wherein the forming of the membrane layer comprises:

forming a first silicon oxide layer on a first surface of a first side of the silicon substrate as an insulation layer;

forming the heater on a portion of the first silicon oxide layer;

forming a first passivation layer on the heater and the first silicon oxide layer;

forming an opening in the first passivation layer corresponding to a portion of the heater;

forming an electrode on the first passivation layer to be coupled to the portion of the heater through the opening of the first passivation layer; and forming a second passivation layer on the electrode and the first passivation layer.

10. The method of claim 9, wherein the forming of the heater comprises:

depositing impurity-doped polysilicon on the first silicon oxide layer.

11. The method of claim 10, wherein the forming of the heater comprises:

patterning the impurity-doped polysilicon in an annular shape.

12. The method of claim 9, wherein the forming of the first passivation layer comprises:

depositing a silicon nitride layer on the heater and the first silicon oxide layer.

13. The method of claim 9, wherein the forming of the electrode comprises:

depositing a conductive metal to a thickness of about 1 $\mu$m using sputtering deposition.

14. The method of claim 9, wherein the forming of the second passivation layer comprises:

depositing a tetraethylorthosilicate (TEOS) oxide layer using a chemical vapor deposition process.

15. The method of claim 9, wherein the forming of the membrane layer comprises:

forming the nozzle in the membrane layer by perforating the second passivation layer, the first passivation layer, and the insulation layer.

16. The method of claim 9, wherein the forming of the ink passage comprises:

forming an ink chamber in the first side of the silicon substrate, the ink chamber communicating with the nozzle of the membrane layer.

17. The method of claim 16, wherein the forming of the ink chamber comprises:

performing anisotropic etching in the first side of the silicon substrate through the nozzle to form a hemisphere as the ink chamber.

18. The method of claim 9, wherein the forming of the ink passage comprises:

forming a second silicon oxide on a second surface of a second side of the silicon substrate;

forming an ink chamber in the first side of the silicon substrate by etching the first side of the silicon substrate through the nozzle;

forming an manifold in the second side of the silicon substrate by etching the second side of the silicon substrate using the second silicon oxide layer as a photoresist of an etch mask; and forming an ink channel between the first side and the second side to couple the manifold to the ink chamber.

19. The method of claim 18, wherein the forming of the ink channel comprises:

performing anisotropic dry etching a portion of the silicon substrate between the ink chamber and the manifold.

20. The method of claim 19, wherein the forming of the ink channel comprises:

performing one of inductively coupled plasma etching and reactive ion etching the potion of the silicon substrate between the first and the second sides of the silicon substrate.

21. The method of claim 19, wherein the ink channel is equal to or less than the nozzle in cross-section perpendicular to a common central axis of the nozzle, the ink channel, and the ink chamber.

22. The method of claim 18, wherein the wall of the silicon substrate defines the ink chamber, the ink channel, and the manifold, and the reprocessing of the wall of the ink passage comprises:

etching the wall of the ink chamber, the ink channel, and the manifold by a depth.

23. The method of claim 22, wherein the reprocessing of the wall of the ink passage comprises:

injecting the $XeF_2$ gas into the ink chamber, the ink channel, and the manifold at a flow speed.

24. The method of claim 22, wherein the reprocessing of the wall of the ink passage comprises:

controlling the flow speed of the $XeF_2$ gas to control the depth etched by the $XeF_2$ gas.

25. The method of claim 22, wherein the ink channel comprises an inlet close to the manifold and an outlet close to the ink chamber, and the reprocessing of the wall of the ink passage comprises:

controlling the flow speed of the $XeF_2$ gas so that the flow speed at the inlet of the ink channel is lower than that at the outlet of the ink channel.

26. The method of claim 25, wherein the wall of the ink channel has a first portion disposed adjacent to the inlet and a second portion disposed adjacent to the outlet, and the reprocessing of the wall of the ink passage comprises:

etching the first portion of the wall of the ink channel by a first depth and the second portion of the wall of the ink chamber by a second depth different from the first depth.

27. The method of clam 26, wherein the first depth is greater than the second depth.

28. The method of claim 26, wherein the ink channel comprises a frustum of a cone shape.

29. The method of claim 7, wherein the silicon substrate is made of silicon, and the reprocessing of the ink passage comprises:

forming $SiF_4$ from the $XeF_2$ gas and the silicon of the silicon substrate on the silicon substrate.

30. The method of claim 29, wherein reprocessing of the ink passage comprises:

etching the wall of the ink passage by a depth by separating the $SiF_4$ from the silicon substrate.

31. The method of claim 7, wherein the forming of the membrane comprises:

forming a first silicon oxide layer on a first surface of a first side of the silicon substrate;

forming a second silicon oxide layer on a second surface of a second side of the silicon substrate opposite to the first surface;

forming the membrane on the first silicon oxide layer;

forming the nozzle in the membrane layer;

forming an ink chamber in the first side of the silicon substrate by etching the first side of the silicon substrate through the nozzle;

forming a manifold in the second side of the silicon substrate by etching the second side of the silicon substrate through the second silicon oxide layer; and forming an ink channel between the first side and the second side to couple the manifold to the ink chamber.

* * * * *